US010562223B2

(12) United States Patent
Suzuki et al.

(10) Patent No.: US 10,562,223 B2
(45) Date of Patent: Feb. 18, 2020

(54) IMPRINT DEVICE

(71) Applicant: National Institute of Advanced Industrial Science and Technology, Tokyo (JP)

(72) Inventors: Kenta Suzuki, Tsukuba (JP); SungWon Youn, Tsukuba (JP); Hiroshi Hiroshima, Tsukuba (JP)

(73) Assignee: NATIONAL INSTITUTE OF ADVANCED INDUSTRIAL SCIENCE AND TECHNOLOGY, Tokyo (JP)

(*) Notice: Subject to any disclaimer, the term of this patent is extended or adjusted under 35 U.S.C. 154(b) by 0 days.

(21) Appl. No.: 15/769,494

(22) PCT Filed: Oct. 17, 2016

(86) PCT No.: PCT/JP2016/080671
§ 371 (c)(1),
(2) Date: Apr. 19, 2018

(87) PCT Pub. No.: WO2017/073388
PCT Pub. Date: May 4, 2017

(65) Prior Publication Data
US 2018/0304522 A1 Oct. 25, 2018

(30) Foreign Application Priority Data
Oct. 29, 2015 (JP) .................. 2015-213220

(51) Int. Cl.
G03F 7/00 (2006.01)
B29C 59/02 (2006.01)
(Continued)

(52) U.S. Cl.
CPC .......... B29C 59/026 (2013.01); B29C 59/002 (2013.01); G03F 7/0002 (2013.01);
(Continued)

(58) Field of Classification Search
CPC ... H01L 21/027; B29C 59/002; B29C 59/026; B29C 2043/023; B29C 2059/023; B29C 59/02; G03F 7/0002; G03F 7/70875
See application file for complete search history.

(56) References Cited

U.S. PATENT DOCUMENTS 9,835,941 B2 * 12/2017 Nakano ................. G03F 7/0002
2012/0199997 A1 * 8/2012 Tanabe ................... B82Y 10/00
264/82
(Continued)

FOREIGN PATENT DOCUMENTS

JP 2004-103817 A 4/2004
JP 2013-232452 A 11/2013
JP 2014-078697 A 5/2014

OTHER PUBLICATIONS

International Preliminary Report on Patentability and Written Opinion issued in PCT/JP2016/080671; dated May 1, 2018.
(Continued)

Primary Examiner — Deoram Persaud
(74) Attorney, Agent, or Firm — Studebaker & Brackett PC

(57) ABSTRACT

An imprint device according to the present invention is provided with a supply device that supplies a plurality of condensable gases, which have different saturated vapor pressures, at a fixed ratio by a first condensable gas tank (6) and a control valve (6a) and a second condensable gas tank (6) and a control valve (7a) when a concave portion formed in a mold is transferred in an atmosphere of a condensable gas, which condenses at a temperature and a pressure in the concave portion, the concave portion being sealed by a resist layer that enters into the concave portion formed in the mold (3). The imprint device makes it possible to prevent resist
(Continued)

filling failure caused by capillary condensation and to adjust pattern line width and shape by using the same mold.

1 Claim, 4 Drawing Sheets

(51) Int. Cl.
    *H01L 21/027*     (2006.01)
    *B29C 59/00*     (2006.01)
    *G03F 7/20*     (2006.01)
    *B29C 43/56*     (2006.01)
    *B29C 43/02*     (2006.01)

(52) U.S. Cl.
    CPC ........ *G03F 7/70875* (2013.01); *H01L 21/027* (2013.01); *B29C 2043/023* (2013.01); *B29C 2043/561* (2013.01); *B29C 2059/023* (2013.01)

(56) References Cited

U.S. PATENT DOCUMENTS

| | | | |
|---|---|---|---|
| 2014/0077123 A1* | 3/2014 | Fukushima | C09K 5/044 252/67 |
| 2015/0075855 A1 | 3/2015 | Ito et al. | |
| 2015/0123300 A1* | 5/2015 | Tanabe | G03F 7/0002 264/40.1 |
| 2015/0210790 A1 | 7/2015 | Ito et al. | |
| 2015/0315322 A1* | 11/2015 | Chiba | G03F 7/029 264/447 |
| 2016/0147143 A1* | 5/2016 | Ito | G03F 7/0002 264/447 |
| 2016/0366769 A1* | 12/2016 | Honma | B29C 35/0805 |
| 2017/0200639 A1* | 7/2017 | Goto | H01L 21/027 |
| 2019/0004421 A1* | 1/2019 | Ito | C08F 220/30 |

OTHER PUBLICATIONS

International Search Report issued in PCT/JP2016/080671; dated Jan. 17, 2017.

Hiroshi Hiroshima et al.; "Control of Bubble Defects in UV Nanoimprint"; Japanese Journal of Applied Physics; 2007; pp. 6391-6394; vol. 46, No. 9B.

Hiroshi Hiroshima; "Release Force Reduction in UV Nanoimprint by Mold Orientation Control and by Gas Environment"; Journal of Vacuum Science and Technology B; Nov./Dec. 2009; pp. 2862-2865; vol. 27, No. 6.

Hiroshi Hiroshima et al.; "Viscosity of a Thin Film of UV Curable Resin in Pentafluoropropane"; Journal of Photopolymer Science and Technology; 2010; pp. 45-50; vol. 23, No. 1.

Sung-Won Youn et al.; "Control of Resin Filling and Pattern Quality of Ultraviolet Nanoimprint Lithography by Pentafluoropropane and Helium Ambience"; Proceedings of 25th International Microprocesses and Nanotechnology Conference (MNC 2012); 2012; 2P-11-76.

* cited by examiner

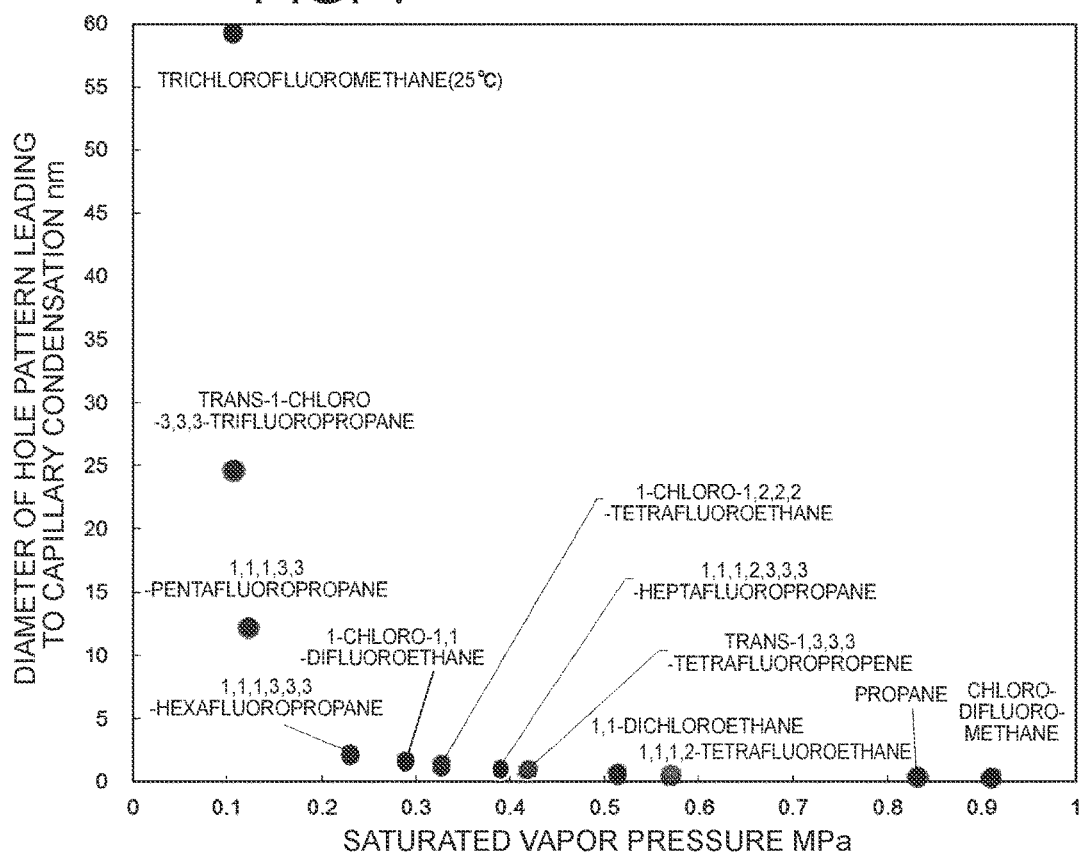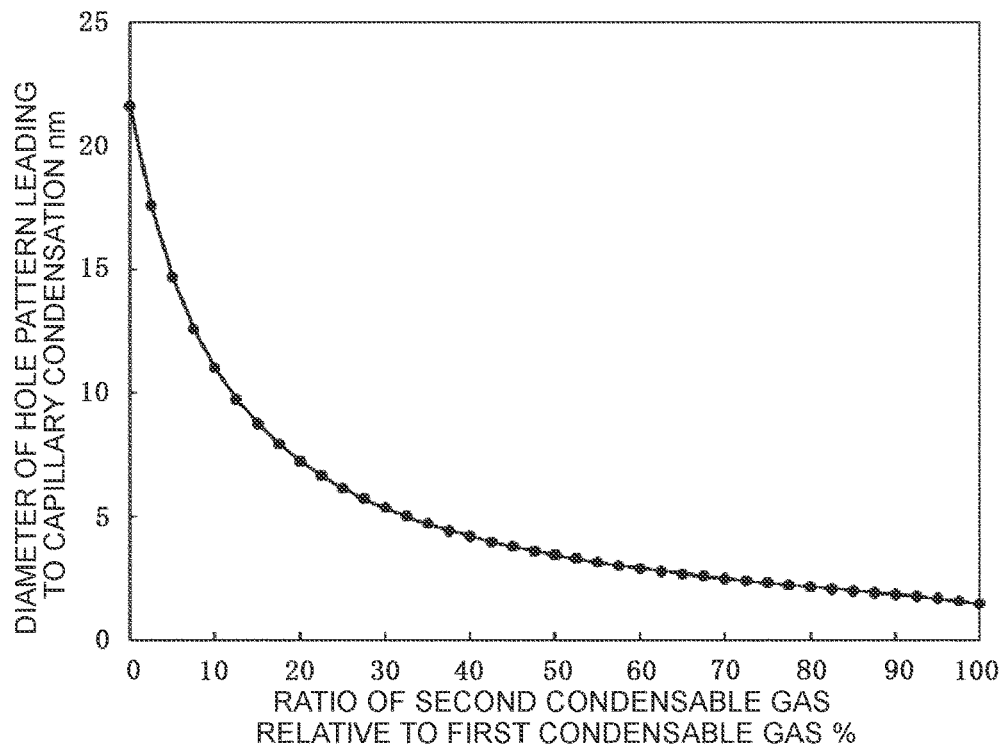

IMPRINT DEVICE

TECHNICAL FIELD

The present invention relates to an imprint device and more particularly to a nano-imprint device adapted to perform transfer with a nano-level high resolution.

BACKGROUND ART

In recent years, in the field of nano-processing of semiconductor devices and the like, the further miniaturization has been leading to a demand for a faster operation and a lower power consumption operation. Further, in the field of semiconductor manufacture, such as semiconductor devices with integrated functions, which are referred to as system LSIs, there has been a demand for a technique for higher precision to achieve integration.

With the background described above, an exposure device or the like used for a lithography technique for creating a pattern of a semiconductor device is becoming extremely more costly as a pattern becomes finer.

As an alternative technique of the lithography technique, which is becoming costly as described above, nano imprint is attracting attention. The devices, materials and the like used for the nano imprint are inexpensive, and yet the nano imprint makes it possible to form a fine pattern having a high resolution of approximately 10 nm.

As the nano imprint, there has been known, for example, thermal imprint whereby to transfer a concavo-convex pattern by heat using a thermoplastic resin, and an optical imprint whereby to transfer a concavo-convex pattern by ultraviolet rays using a photocurable resin.

In the case of the nano imprint described above, once a mold is made, a nano structure can be molded easily and repeatedly, thus leading to higher throughput with resultant increased economy. Further, the nano imprint is a processing technique that produces less harmful wastes, so that the nano imprint is recently being expected to find applications in a variety of fields, such as bit patterned media used with next-generation hard disks, in addition to semiconductor devices.

However, according to the nano imprint technique, if a mold is pressed against a resist (photocurable resin) in an air atmosphere, then air is sealed between a concave portion of the mold and the resist, and the air remains although the volume thereof decreases under compression, thus forming a space not filled with the resist. This leads to a problem in that accurate transfer of a mold shape is impossible.

The air taken in such a compressed state does not necessarily remain evenly in a concave portion of the mold, and interferes with the flow of the resin, causing the energy on the surface of the resin to decrease. As a result, the air remains in a bubbly state in the concave portion of the mold, so that a missing portion occurs in a pattern on a resist layer after completion of a transfer operation, thus leading to the degradation of transfer accuracy.

As a countermeasure to the above, the process for pressing a mold against a resist according to the imprint technique could be carried out in a vacuum, or the pressure used to press a mold could be considerably increased so as to decrease the volume of the air taken in.

However, carrying out the process for pressing a mold against a resist in a vacuum would require a robust operation chamber that could survive a vacuum. Further, if the pressure used to press the mold is excessively increased, then the mold itself would be deformed, making it impossible to perform transfer with high accuracy, or leading to damage to the mold and a substrate material in a worst case.

Therefore, as described in Patent Document 1, the present inventors have proposed a technique for preventing the degradation of transfer accuracy attributable to a gas, which is introduced to form an imprinting atmosphere, even when a relatively low pressure is used for pressing a mold. According to the technique, a condensable gas is supplied into an operation chamber, and the sealed condensable gas is condensed.

More specifically, the imprint for transferring concaves and convexes, which are formed on a mold, onto the layer of a resist applied to the surface of a base material or onto a supplied resist is carried out in the atmosphere of a gas that condenses at the temperature and the pressure in a concave portion when the layer of the resist enters into the concave portion formed in the mold. According to Patent Document 1, the vapor pressure of the gas at normal temperature is 0.05 MPa or more and 1.00 MPa or less.

Meanwhile, in Non-Patent Document 1, Non-Patent Document 2, and Non-Patent Document 3, the present inventors have identified the relationship between a gas flow rate (the ratio of a gas in relation to air) and the speed of charging a resist into a mold by supplying a 1, 1, 1, 3, 3-pentafluoropropane (pentafluoropropane), which is a type of condensable gas, between the resin and the mold, and have also reported that the viscosity of a resin before being cured can be decreased and the force for separating a cured resin from a mold (mold releasing force) can be decreased.

Further, the present inventors have reported in Non-Patent Document 4 that the surface roughness of a formed pattern, the mold releasing force, and the speed of charging a resist into a mold can be adjusted by carrying out nano imprint in the atmosphere of a mixture of one type of pentafluoropropane, which is a condensable gas, and a helium gas.

CITATION LIST

Patent Document

Patent Document 1: Japanese Patent Application Laid-Open No. 2004-103817

Non-Patent Document

Non-Patent Document 1: H. Hiroshima and M. Komuro, Japanese Journal of Applied Physics Volume 46, Number 9 (2007) 6391-6394

Non-Patent Document 2: H. Hiroshima, Journal of Vacuum Science and Technology B27(6)(2009) 2862-2865

Non-Patent Document 3: H. Hiroshima and H. Atobe, Journal of Photopolymer Science and Technology Volume 23, Number 1 (2010) 45 to 50

Non-Patent Document 4: S.-W. Youn, K. Suzuki, Q. Wang and H. Hiroshima, Proceedings of 25th International Microprocesses and Nanotechnology Conference (MNC 2012), (2012), 2P-11-76

SUMMARY

Technical Problem

In the case of a pattern having a microgroove of 100 nm or less, such as a mold used in imprint, there has been known a phenomenon called "capillary condensation" that occurs due to the influence of a capillary force acting in a micro space.

In general, vapor in a micro hole easily turns into a liquid, as compared with vapor outside the micro hole, due to a capillary force. This phenomenon is called "the capillary condensation." As described in Patent Document 1, if a condensable gas having a low saturated vapor pressure is used, then the possibility of the occurrence of the capillary condensation is increased, as compared with water or the like.

Especially in the case of a microgroove pattern having a line width of 100 nm or less, which is the line width of a leading-edge semiconductor, if a condensable gas having a low saturated vapor pressure is used, then the condensable gas will inconveniently develop dew condensation due to the capillary condensation before the grooves of a mold are filled with a photocurable resin. This may lead to the filling failure of a resist, resulting in a patterning failure.

Meanwhile, according to photolithography using a semiconductor stepper or a scanner, which is currently prevailing, lithography is accomplished by reducing and projecting a light shielding film pattern formed on a photomask (reticle) onto a resist on a substrate through a lens, and performing exposure to light and development.

The photolithography is strictly for forming a mask pattern for etching an object, such as a base film or a substrate. After the photolithography process, a film forming step or dry/wet etching step is carried out.

In the film producing step or the etching step, a resist pattern formed by the photolithography will always involve dimensional changes. Normally, therefore, in the trial production of a device, the process flow that includes all steps, including the photolithography, the film forming step, and the etching step, is repeated, thus taking a long time to optimize pattern line width and shape.

Especially in the case of the photolithography, the fine adjustment of a line width of approximately 10% is performed by the exposure dose of an exposure device and developing time, so that the foregoing operation is required whenever a photomask is replaced or a resist material is changed.

In other words, when the nano imprint is applied to the photolithography, the structure of a mold will be faithfully transferred, so that there is a restriction that only a pattern of predetermined dimensions can be formed.

Hence, if dimensional control is difficult in a subsequent film forming step or etching step, then a mold has to be remade, taking time to start up the manufacture of a device. This has been a bottleneck for improving cycle time, as compared with the conventional photolithography.

Further, a nano imprint mold must be created by an electron beam drawing device and etching, so that fabricating one mold requires a great amount of time and cost. Thus, introducing the nano imprint is a factor of increased manufacturing cost.

Accordingly, an object of the present invention is to prevent a resist filling failure attributable to capillary condensation and to make it possible to adjust a pattern line width and shape even if the same mold is used.

Solution to Problem

A description will be first given of the capillary condensation.

The condition under which the capillary condensation will occur is determined according to an expanded Kelvin equation:

$$\ln\left(\frac{p}{p_0}\right) = -2V\gamma\cos\theta/aRT \tag{1}$$

where
$p_0$: Saturated vapor pressure of condensable gas
$p$: Actual vapor pressure
$V$: Liquid molar volume of condensable gas (m$^3$/mol)
$\gamma$: Liquid surface tension of condensable gas (N/m)
$R$: Gas constant (8.31 m$^2$kg/s$^2$Kmol)
$T$: Temperature 293.15K (20° C.)
$\theta$: Contact angle
$a$: Radius of capillary tube m The above expression is transformed as shown below to determine the radius of the capillary tube a, in which the capillary condensation takes place.

$$a = -2V\gamma\cos\theta/RT\ln\left(\frac{p}{p_0}\right) \tag{2}$$

In the case of, for example, trans-1-chloro-3, 3, 3-trifluoropropene (saturated vapor pressure at 20° C.: 0.107 MPa), V denoting the liquid molar volume of a condensable gas will be 100.7×10$^{-6}$ m$^3$/mol, γ denoting the liquid surface tension of the condensable gas will be 0.0133 N/m (20° C.), R denoting the gas constant will be 8.31 m$^2$kg/s$^2$Kmol, and T denoting temperature will be 293.15K (20° C.). Considering the process under atmospheric pressure, p denoting the actual vapor pressure will be 101.3 kPa.

The liquid of the condensable gas has a low surface tension and extremely high wettability. Hence, the contact angle θ is assumed to be 0°. The above is substituted in expression (2), thereby determining the capillary tube radius, a ≤10.82 nm.

The diameter of a hole pattern will be 2a, thus determining 21.64 nm.

In the case of a hole-shaped pattern having a diameter of 21.64 nm or less, it is predicted that performing the nano imprint in a trans-1-chloro-3,3,3-trifluoropropene gas atmosphere will inconveniently cause dew condensation in the grooves of a mold due to the capillary condensation, thus interfering with the charging of a photocurable resin and the formation of a pattern.

Meanwhile, in the case of the trans-1, 3, 3, 3-tetrafluoropropene, the saturated vapor pressure at 20° C. of which is 0.419 MPa, p denoting the actual vapor pressure will be 101.3 kPa, V denoting the liquid molar volume of the condensable gas will be 101.8×10$^{-6}$ m$^3$/mol, γ denoting the liquid surface tension of the condensable gas will be 0.00855 N/m, R denoting the gas constant will be 8.31 m$^2$kg/s$^2$Kmol, and T denoting temperature will be 293.15K (20° C.), and θ denoting the contact angle will be 0°.

Substituting the above in expression (2) determines the capillary tube radius, a ≤0.50 nm. This indicates that there will be no influence of the capillary condensation on the dimensions of a semiconductor pattern of 5 nm to a few hundred nm to which the nano imprint is applied.

FIG. 1 is a graph illustrating the hole pattern diameter that leads to the capillary condensation for each type of condensable gas having a different saturated vapor pressure.

The graph indicates that, in the case of a first condensable gas having a saturated vapor pressure of 0.05 MPa or more and below 0.2 MPa at normal temperature, the hole pattern diameter that leads to the capillary condensation is 10 nm or more. It can be seen that an elemental gas will inconveniently be affected by the capillary condensation.

Meanwhile, a second condensable gas having a saturated vapor pressure of 0.2 MPa or more and 1 MPa or less at normal temperature will not be affected by the capillary condensation at the pattern dimensions of 5 nm to a few hundred nm to which the nano imprint is expected to be applied.

Accordingly, on the assumption of the application to actual manufacture, it can be seen that the influence of the capillary condensation can be obviated by selecting appropriate gases from a first condensable gas group and a second condensable gas group, considering non-fluorocarbon, global warming potential, the process pressure of the nano imprint (if the nano imprint is performed with a condensable gas having a saturated vapor pressure that is higher than the process pressure, then a bubble defect due to condensation failure results in a patterning failure), and selecting their component ratios.

Regarding the adjustment of pattern line width and shape, the present inventors have verified the fluctuation phenomenon of pattern dimensions after imprint due to gas molecules being taken into a resin when a condensable gas having a low saturated vapor pressure, such as pentafluoropropane, is used.

As a solution to the foregoing problem, the present invention provides an imprint device adapted to transfer a concave portion formed in a mold in an atmosphere of a condensable gas, which condenses at a temperature and a pressure in the concave portion, the concave portion being sealed by a resist layer that enters into the concave portion formed in the mold, the imprint device being provided with the imprint device with a supply unit that supplies a plurality of condensable gases having different saturated vapor pressures at a fixed ratio as the foregoing condensable gas.

Advantageous Effects of Invention

The present invention makes it possible to achieve excellent imprint with high transfer accuracy by mixing a condensable gas having a low saturated vapor pressure and a condensable gas having a high saturated vapor pressure thereby to generate a condensation reaction over an entire area without being affected by the capillary condensation.

Further, the width of a nano-imprinted pattern can be freely changed by freely controlling the atmosphere of a mixture of condensable gases having different saturated vapor pressures. Thus, once a single mold is created, transfer patterns having various line widths can be created.

BRIEF DESCRIPTION OF DRAWINGS

FIG. 1 is a graph illustrating the diameter of a hole pattern that leads to capillary condensation for each condensable gas having a different saturated vapor pressure;

FIG. 2 is a graph illustrating the ratio between a first condensable gas (trans-1-chloro-3,3,3-trifluoropropene gas) and a second condensable gas (trans-1,3,3,3-tetrafluoropropene) versus the diameter of a hole pattern that leads to the capillary condensation;

DESCRIPTION OF EMBODIMENTS

Figure 3:
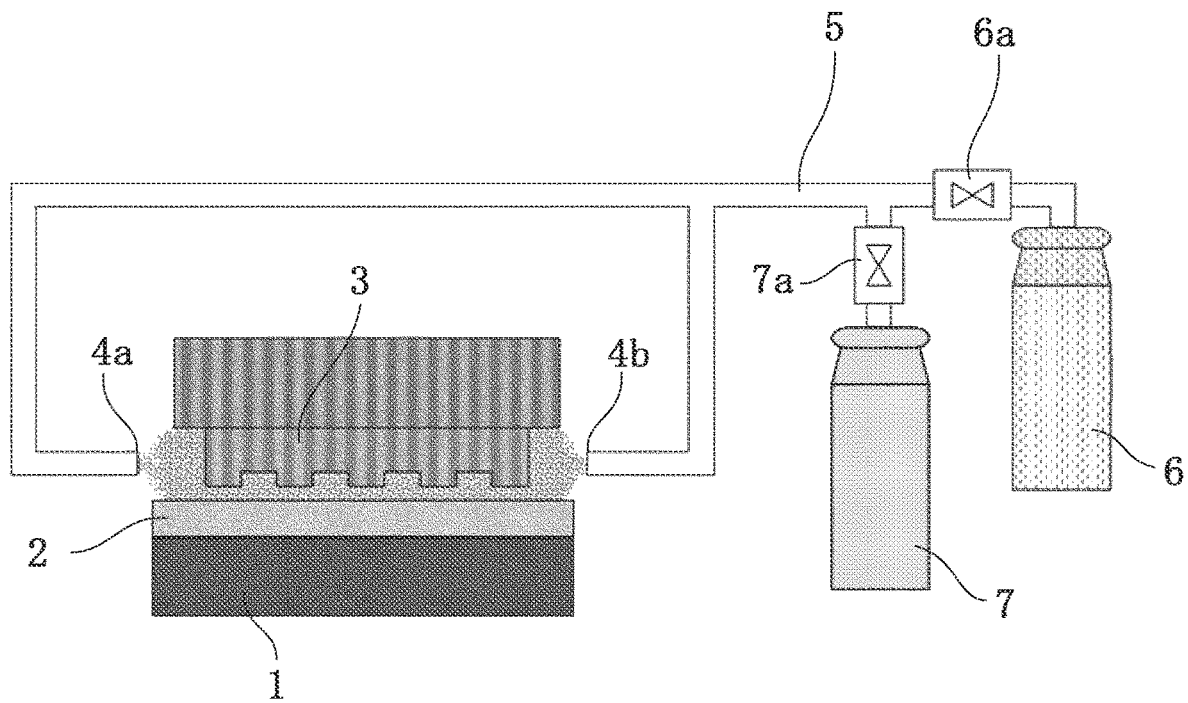
FIG. 3 is a diagram illustrating the outline of a nano imprint device according to an embodiment.

The following will describe an embodiment with reference to the accompanying drawings.

EXAMPLE

The present example will enable excellent imprint with high transfer accuracy by mixing a condensable gas having a low saturated vapor pressure and a condensable gas having a high saturated vapor pressure thereby to generate a condensation reaction over an entire area without being affected by the capillary condensation.

To be specific, the pattern dimensions that lead to the capillary condensation when mixing the first condensable gas and the second condensable gas having different saturated vapor pressures as described above can be determined by the calculation according to expression (1).

The influence rate of the capillary condensation can be approximately determined according to expression (3) given below by simply adding the influences of the first condensable gas and the second condensable gas on the basis of partial pressure, assuming that the two condensable gases have been mutually diluted.

$$a \leq -2V_1\gamma_1\cos\theta / RT\ln\left(\frac{p_1}{p_{01}}\right) + -2V_2\gamma_2\cos\theta / RT\ln\left(\frac{p_2}{p_{02}}\right) \quad (3)$$

where $p_{01}$: Saturated vapor pressure of the first condensable gas $p_{02}$: Saturated vapor pressure of the second condensable gas $p_1$: Partial pressure of the first condensable gas $p_2$: Partial pressure of the second condensable gas $V_1$: Liquid molar volume of the first condensable gas ($m^3$/mol)

$V_2$: Liquid molar volume of the second condensable gas ($m^3$/mol)

$\gamma_1$: Liquid surface tension of the first condensable gas (N/m)

$\gamma_2$: Liquid surface tension of the second condensable gas (N/m)

$\theta$: Contact angle

R: Gas constant (8.31 $m^2$kg/$s^2$Kmol)

T: Temperature 293.15K (20° C.)

a: Radius of capillary tube (m)

FIG. 2 is a graph illustrating the ratio of mixed gas versus the diameter of a hole pattern that leads to the occurrence of the capillary condensation when mixing, for example, trans-1-chloro-3,3,3-trifluoropropene (the saturated vapor pressure at 20° C. being 0.107 MPa) as the first condensable gas and trans-1,3,3,3-tetrafluoropropene (the saturated vapor pressure at 20° C. being 0.419 MPa) as the second condensable gas.

In this case, in order to apply the present method for a pattern dimensions ranging from 5 nm to a few hundred nm to which the nano imprint is expected to be applied, the nano imprint should be carried out under a condition in which the ratio of the second condensable gas with respect to the first condensable gas is 35% or more. At this ratio, the diameter of a hole pattern leading to the occurrence of the capillary condensation is 5 nm or less.

FIG. 3 is a diagram illustrating the outline of a nano imprint device according to the present embodiment.

The imprint device presses a mold 3, which has a fine pattern formed thereon, against the photocurable resin 2, which has been formed in a molten state on the substrate 1. Holding the mold 3 and the photocurable resin 2 in contact with each other, the photocurable resin 2 is hardened thereby to transfer the pattern onto the substrate 1.

The imprint device described above is used to manufacture, for example, semiconductor devices and microsensors.

As the substrate 1, silicon or glass, for example, is used. As the mold 3, glass, transparent resin, or the like is used. The film of the photocurable resin 2 is formed on the substrate 1 by, but not limited to, a spin coater, a dispenser, an inkjet, a bar coater, an applicator, and a spray coater.

The photocurable resin 2 is acryl-based, epoxy-based, silicone-based or phenol-based, but not limited thereto insofar as the resin is a photocurable resin composition.

The imprint transfer method is, for example, a method in which patterns are transferred in one operation by using the mold 3 having a pattern of approximately the same size as a substrate, a step-and-repeat method in which a pattern is transferred in a plurality of times by using a mold having a pattern that is smaller than a substrate, or a roll method in which patterns are consecutively transferred by using a cylindrical mold; however, the imprint transfer method is not limited thereto insofar as the transfer method uses a mold or a die.

Nozzles 4a and 4b are installed in a space formed between the substrate 1 and the mold 3. Through a condensable gas supply pipe 5, the first condensable gas and the second condensable gas are supplied at a fixed ratio from a first condensable gas tank 6 and a second condensable gas tank 7 through control valves 6a and 7a, respectively.

Thus, the method in which a plurality of condensable gases are supplied into the space formed between the substrate 1 and the mold 3 makes it extremely easy to create an environment of a highly concentrated mixed gas; however, the method is not limited thereto insofar as a method makes it possible to create a mixed atmosphere between the substrate 1 and the mold 3, such as a method in which a closed space is created for each imprint space, such as a chamber.

To be specific, first, PAK-01 (made by TOYO GOSEI), which is a UV-curable resin was spin-coated to a film thickness of 80 nm on a 4-inch silicon substrate. As the mold, a 10 mm-square quartz mold (NIM-PHL45 made by NTT-AT) was used. Further, a step-and-repeat type nano imprint device was used.

The imprint conditions were 0.1-MPa applied pressure, 10-second pressurization time, 100-mJ/cm$^2$ UV irradiation intensity, and 1-second irradiation time. Trans-1-chloro-3,3,3-trifluoropropene, the saturated vapor pressure at 20° C. of which is 0.107 MPa, was used as the first condensable gas, and trans-1,3,3,3-tetrafluoropropene, the saturated vapor pressure at 20° C. of which is 0.419 MPa, was used as the second condensable gas.

The nano imprint was carried out five times, during which the ratio between the first condensable gas and the second condensable gas was changed by 25% while setting the flow rates of the first condensable gas and the second condensable gas by the control valves 6a and 7a such that the total of the flow rates of these two gases is maintained to be 2000 sccm.

The first condensable gas was 100% and the second condensable gas was 0% for the first nano imprint, the first condensable gas was 75% and the second condensable gas was 25% for the second nano imprint, the first condensable gas was 50% and the second condensable gas was 50% for the third nano imprint, the first condensable gas was 25% and the second condensable gas was 75% for the fourth nano imprint, and the first condensable gas was 0% and the second condensable gas was 100% for the fifth nano imprint.

However, in every nano imprint, small amounts of inevitable components, such as nitrogen and oxygen, are contained.

The shapes of the patterns formed by the imprint were observed under an electron microscope (FE-SEM). Thereafter, based on acquired image files, two line patterns were extracted, and the average line width of the patterns was calculated by using a line width determination program.

Figure 4:
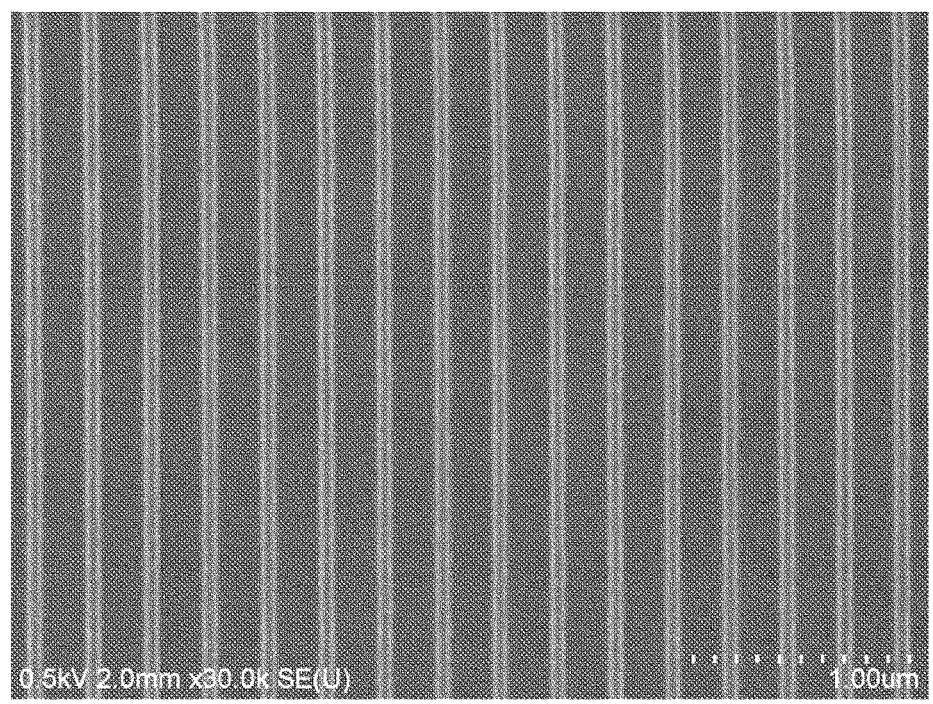
FIG. 4 is an electron microscope image of a pattern formed on a photocurable resin 2 on a substrate 1 by transferring a mold structure, in which each linear groove has a 70-nm width and a 100-nm depth, in an atmosphere of the first condensable gas 50% and the second condensable gas 50%.
Figure 5:
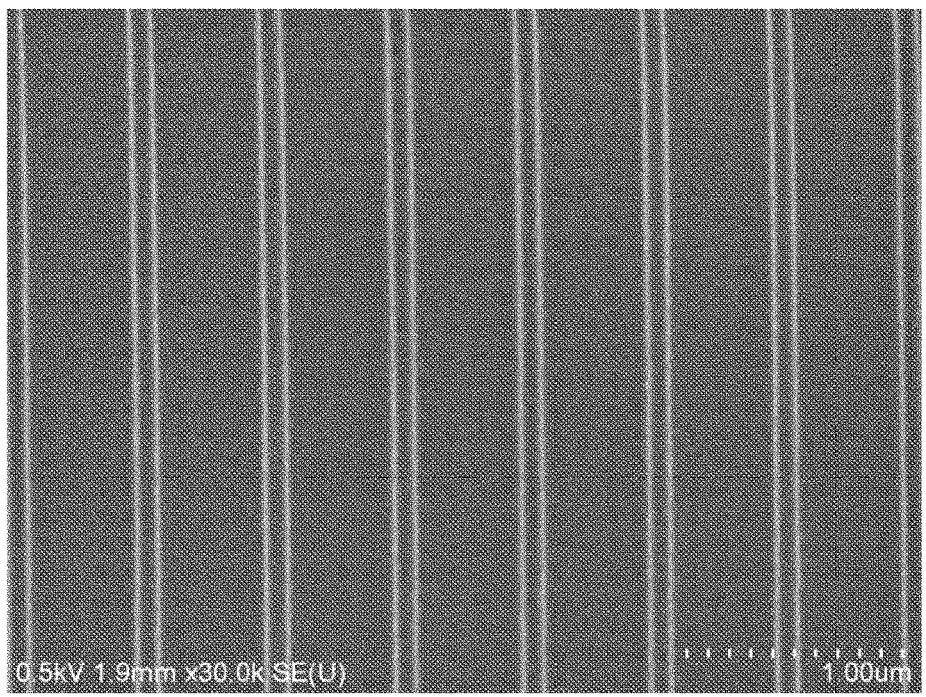
FIG. 5 is an electron microscope image of a pattern formed on the photocurable resin 2 on the substrate 1 by transferring a mold structure, in which each linear groove has a 125-nm width and a 100-nm depth, in an atmosphere of the first condensable gas 50% and the second condensable gas 50%.

FIG. 4 and FIG. 5 illustrate the electron microscope images of the patterns transferred by imprint onto the photocurable resin 2 on the substrate 1 in the atmosphere of the first condensable gas of 50% and the second condensable gas of 50%.

FIG. 4 illustrates the pattern obtained by transferring a mold structure of linear grooves, each of which has a 70-nm width and a 100-nm depth, and FIG. 5 illustrates the pattern obtained by transferring a mold structure of linear grooves, each of which has a 125-nm width and a 100-nm depth. The patterns illustrated in both figures have been successfully formed, being free of pattern defects, such as bubble defects.

Figure 6:
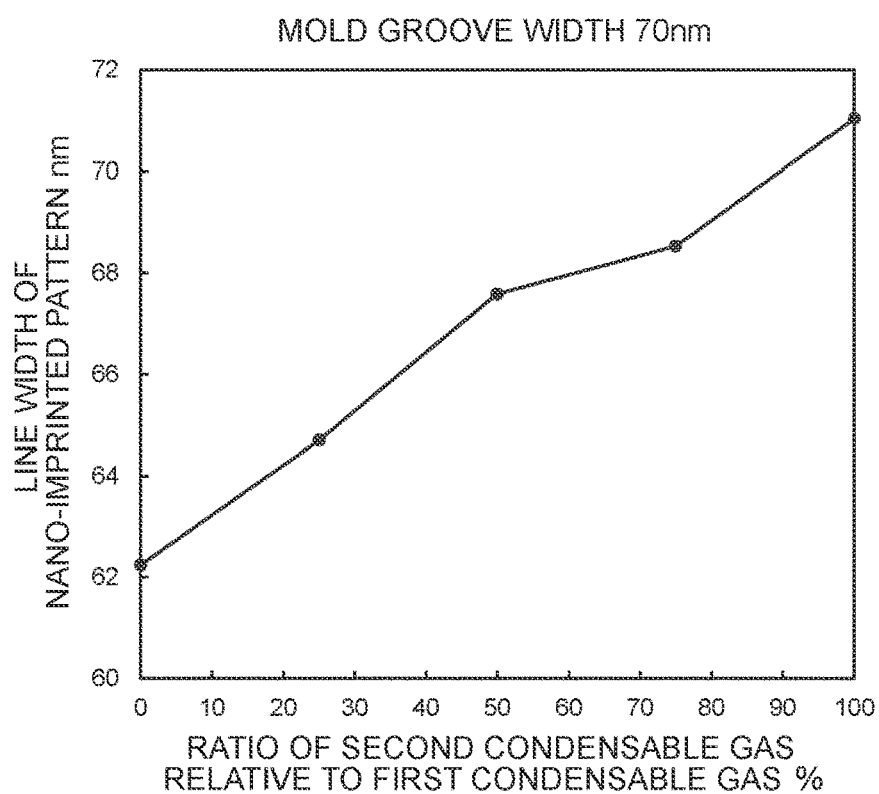
FIG. 6 is a graph illustrating the line width of the pattern formed by transferring the mold structure, in which each linear groove has the 70-nm width and the 100-nm depth, in atmospheres of different mixing conditions of the first condensable gas and the second condensable gas.

FIG. 6 is a graph illustrating the line width of the pattern formed by transferring the mold structure, in which each linear groove has the 70-nm width and the 100-nm depth, in atmospheres of different mixing conditions of the first condensable gas and the second condensable gas.

When the proportion of the second condensable gas was 0% (i.e. when the first condensable gas was 100%), the line width of the imprinted pattern was the smallest. Conversely, when the proportion of the second condensable gas was 100% (i.e. when the first condensable gas was 0%), the line width of the imprinted pattern was the largest.

At a medium ratio, it was verified that the line width varies with high linearity, depending on the proportion of the second condensable gas. This indicates that the line width of a pattern that can be formed can be freely controlled by adjusting the ratio of mixed gases.

Figure 7:
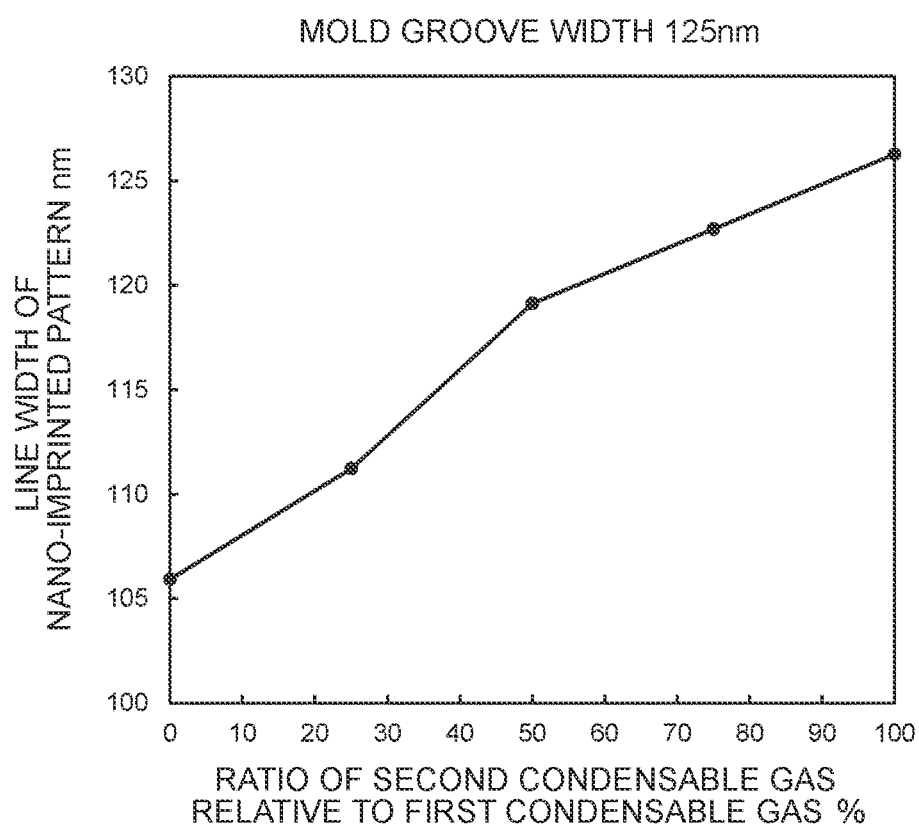
FIG. 7 is a graph illustrating the line width of the pattern formed by transferring the mold structure, in which each linear groove has the 125-nm width and the 100-nm depth, in atmospheres of different mixing conditions of the first condensable gas and the second condensable gas.

FIG. 7 is a graph illustrating the line width of the pattern formed by transferring the mold structure, in which each linear groove has the 125-nm width and the 100-nm depth, in atmospheres of different mixing conditions of the first condensable gas and the second condensable gas. As with the above case, it could be verified that the line width varies with high linearity, depending on the proportion of the second condensable gas.

REFERENCE SIGNS LIST

1: Substrate
2: Photocurable resin

3: Mold
4a, 4b: Nozzle
5: Condensable gas supply pipe
6: First condensable gas tank
7: Second condensable gas tank
6a, 7a: Control valve

What is claimed is:

1. An imprint device adapted to transfer a concave portion, which is formed in a mold, in an atmosphere of a condensable gas that condenses at a temperature and a pressure in the concave portion, the concave portion being sealed by a resist layer that enters into the concave portion formed in the mold, the imprint device comprising:
   a supply unit that supplies a plurality of condensable gases having different saturated vapor pressures at a fixed ratio as the condensable gas,
   wherein the plurality of condensable gases having different saturated vapor pressures include a first condensable gas, the saturated vapor pressure of which at normal temperature is 0.05 MPa or more and below 0.2 MPa, and a second condensable gas, the saturated vapor pressure of which at normal temperature is 0.2 MPa or more and 1 MPa or less, and
   the first condensable gas includes at least trans-1-chloro-3,3,3-trifluoropropene, and the second condensable gas includes at least trans-1,3,3,3-tetrafluoropropene.

* * * * *